(12) United States Patent
Yagi

(10) Patent No.: US 6,236,234 B1
(45) Date of Patent: May 22, 2001

(54) HIGH-SPEED LOW-POWER CONSUMPTION INTERFACE CIRCUIT

(75) Inventor: Masami Yagi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/605,393

(22) Filed: Jun. 29, 2000

(30) Foreign Application Priority Data

Jul. 2, 1999 (JP) .................................................. 11-189152

(51) Int. Cl.[7] .............................................. H03K 19/0175
(52) U.S. Cl. .............................................................. 326/80
(58) Field of Search .............................. 326/56, 57, 80, 326/82, 83; 365/226, 227; 323/270, 271, 273, 275, 282, 283

(56) References Cited

U.S. PATENT DOCUMENTS 4,096,398 * 6/1978 Khaitan .................................. 307/237
5,345,357 * 9/1994 Pianka ..................................... 361/56
6,084,430 * 7/2000 Wayner .................................... 326/80

* cited by examiner

*Primary Examiner*—Matthew V. Nguyen
(74) *Attorney, Agent, or Firm*—McGuireWoods LLP

(57) ABSTRACT

An interface circuit has a tri-state buffer responsive to a control signal and an input signal for changing an output terminal thereof between high impedance state and low impedance state and for changing the output terminal between a positive high power voltage and a ground level, and an n-channel enhancement type field effect transistor connected between the output terminal and an external signal terminal and having a gate electrode connected to a positive middle power voltage so as to swing said external signal terminal between the positive middle power voltage and the ground level, thereby reducing the consumption of the middle power voltage.

13 Claims, 3 Drawing Sheets

HIGH-SPEED LOW-POWER CONSUMPTION INTERFACE CIRCUIT

FIELD OF THE INVENTION

This invention relates to an integrated circuit and, more particularly, to an interface circuit with a tri-state buffer incorporated in a semiconductor integrated circuit device.

DESCRIPTION OF THE RELATED ART

A standard tri-state buffer is usually incorporated in the peripheral circuit of a microcomputer. The standard tri-state buffer is changed between high impedance state and low impedance state. When a data signal is output from or input into the microcomputer, the standard tri-state buffer is changed to the low impedance state, and the transfers digital data signals between an internal bus and an external bus system in a time division multiplexing fashion. However, if the standard tri-state buffer is changed to the high impedance state, the internal bus is electrically isolated from the external bus system, and any digital data signal is not permitted to pass through the standard tri-state buffer. A large amount of parasitic capacitance is usually coupled to the external bus system, and the standard tri-state buffer swings the data signals in a relatively narrow potential range.

The standard tri-state buffer has a control node, a data input node and a data output node. A control signal representative of the high impedance state or the low impedance state is supplied to the control node so as to change the standard tri-state buffer between the high impedance state and the low impedance state. While the standard tri-state buffer is operating in the low impedance state, the standard tri-state buffer is responsive to the digital data signal at the input node so as to change the logic level at the output node thereof.

An open-drain type tri-state buffer fixes the output node to a high voltage level in the high impedance state. The output node is connected through a pull-up resistor to a power supply line, and the output node is pulled up to the power voltage level in the high impedance state.

The tri-state buffer may be connected to an external circuit powered with a power voltage lower than the power voltage therein. The tri-state buffer changes the output node to the low power voltage in response to the digital data signal of the high level.

FIG. 1 shows a typical example of the input/output interface circuit. An internal control terminal 1, an internal data input terminal 2, an external signal terminal 3 and an internal data output terminal 4 are associated with the prior art input/output interface circuit. The prior art input/output interface circuit is broken down into a signal input circuit 18 and a signal output circuit 20.

The signal input circuit 18 is connected between the external signal terminal 3 and the internal data output terminal 4, and responsive to the potential level at the external signal terminal 3 so as to change the internal data output terminal 4 between the two potential levels corresponding to the two logic levels.

The signal output circuit 20 is implemented by the prior art standard tri-state buffer. The prior art tri-state buffer includes a complementary inverter, i.e., a series combination of a p-channel enhancement type field effect transistor 11 and an n-channel enhancement type field effect transistor 12, a two-input NAND gate 13, a two-input AND gate 14 and an inverter 16. The complementary inverter 11/12 is connected between a power voltage line VDD2 and a ground line VSS, and the external signal terminal 3 is connected to the common drain node between the p-channel enhancement type field effect transistor 11 and the n-channel enhancement type field effect transistor 12. The power supply line VDD2 is lower in potential level than a main power supply line (not shown) connected to the two-input NAND gate 13, the two-input AND gate 14 and the inverter 16.

The internal control terminal 1 is directly connected to one input node of the two-input NAND gate 13 and one input node of the two-input AND gate 14. The internal data input terminal 2 is directly connected to the other input node of the two-input NAND gate 13, and is connected through the inverter 16 to the other input node of the AND gate 14. The output node of the two-input NAND gate 13 is connected to the gate electrode of the p-channel enhancement type field effect transistor 11, and the output node of the two-input AND gate 14 is connected to the gate electrode of the n-channel enhancement type field effect transistor 12.

The signal output circuit 20 behaves as follows. When a control signal changes the internal control terminal 1 to a low voltage level, the two-input NAND gate 13 and the two-input AND gate 14 are disabled with the low voltage level at the internal control terminal 1, and fix the output nodes to a high voltage level and a low voltage level, respectively. The high voltage level and the low voltage level are supplied to the gate electrode of the p-channel enhancement type field effect transistor 11 and the n-channel enhancement type field effect transistor 12, respectively, and both field effect transistors 11/12 are turned off. Thus, the signal output circuit 20 or the prior art standard tri-state buffer enters the high impedance state in the presence of the control signal of the low voltage level.

When the control signal is changed to the high voltage level, the two-input NAND gate 13 and the two-input AND gate 14 are enabled with the high voltage level, and become responsive to the potential level at the internal input terminal 2.

If the internal input terminal 2 is in the high voltage level, the high voltage level is directly supplied to the two-input NAND gate 13, and the two-input NAND gate 13 changes the output node to the low level. On the other hand, the inverter 16 supplies the low voltage level to the two-input AND gate 14, and the two-input AND gate 14 changes the output node to the low voltage level. With the low voltage level, the p-channel enhancement type field effect transistor 11 turns on, and the p-channel enhancement type field effect transistor 12 turns off. Thus, the power supply line VDD2 is connected through the p-channel enhancement type field effect transistor 11 to the external signal terminal 3, and an output signal of the high voltage level VDD2 is supplied from the external signal terminal 3 to the external bus system.

If the internal input terminal 2 is in the low voltage level, the low voltage level is directly supplied from the internal input terminal 2 to the two-input NAND gate 13, and the two-input NAND gate 13 changes the output node to the high voltage level. With the high voltage level, the p-channel enhancement type field effect transistor 11 turns off, and the external signal terminal 3 is electrically isolated from the power supply line VDD2. On the other hand, the inverter 16 supplies the high voltage level to the two-input AND gate 14, and the two-input AND gate 14 changes the output node to the high voltage level. With the high voltage level, the n-channel enhancement type field effect transistor 12 turns on, and the external signal terminal 3 is connected through the n-channel enhancement type field effect transistor 12 to the ground line VSS. The output signal is changed to the low voltage level.

The signal output circuit 20 changes the external signal terminal 3 between the power voltage level VDD2 and the ground level VSS in the low impedance state, and the output signal is swung in the narrow potential range.

Turning to FIG. 2 of the drawings, another prior art input/output interface circuit is also broken down into a signal input circuit 18 and a signal output circuit 22. The signal input circuit 18 is similar to that of the prior art input/output interface circuit shown in FIG. 1, and no further description is incorporated hereinbelow for avoiding repetition. However, the signal output circuit 22 is implemented by the prior art open-drain type tri-state buffer.

The signal output circuit 22 includes an n-channel enhancement type field effect transistor 12, a two-input AND gate 14 and an inverter 16, and the external signal terminal 3 is connected through a pull-up resistor R to a power supply line VDD2. A parasitic capacitor C is further connected between the external signal terminal 3 and the ground VSS. The internal input terminal 1 is connected to one input node of the two-input AND gate 14, and the internal control terminal 2 is connected through the inverter 16 to the other input node of the two-input AND gate 14. The n-channel enhancement type field effect transistor 12 is connected between the external signal terminal 3 and the ground line VSS, and the output node of the two-input AND gate 14 is connected to the gate electrode of the n-channel enhancement type field effect transistor 12.

When the internal control terminal 1 is changed to the low voltage level, the two-input AND gate 14 is disabled with the low voltage level, and fixes the output node thereof to the low voltage level. The low voltage level is supplied from the two-input AND gate 14 to the gate electrode of the n-channel enhancement type field effect transistor 12, and keeps the n-channel enhancement type field effect transistor 12 off. Thus, the prior art open-drain type tri-state buffer enters the high impedance state in the presence of the low voltage level at the internal control terminal 1.

When the internal control terminal 1 is changed to the high voltage level, the two-input AND gate 14 is enabled with the high voltage level, and becomes responsive to the potential level at the internal input terminal 2. In other words, the prior art open-drain type tri-state buffer enters the low impedance state.

In the low impedance state, the high voltage level at the internal input terminal 2 causes the two-input AND gate 14 to change the output node thereof to the low level, and the n-channel enhancement type field effect transistor 12 turns off. The external signal terminal 3 is electrically isolated from the ground line VSS, and an output signal of the power voltage level VDD2 is supplied to the external bus system. On the other hand, the low voltage level at the internal input terminal 2 causes the two-input AND gate 14 to supply the high voltage level to the gate electrode of the n-channel enhancement type field effect transistor 12. The n-channel enhancement type field effect transistor 12 turns on, and the external signal terminal 3 is electrically connected through the n-channel enhancement type field effect transistor 12 to the ground line VSS. As a result, the external signal terminal 3 is discharged through the n-channel enhancement type field effect transistor 12 to the ground line VSS, and the output signal is changed to the low level. Thus, the prior art open-drain type tri-state buffer 22 also changes the external signal terminal 3 between the power voltage level VDD2 and the ground level.

A problem is encountered in the prior art input/output interface circuit shown in FIG. 1 in a large power circuit. The logic gates 13/14 and the complementary inverter 11/12 are powered with the power supply lines different in potential level, and the complementary inverter 11/12 consumes a large amount of electric power for driving the external bus system between the power voltage level VDD2 and the ground level VSS.

A problem inherent in the prior art input/output interface circuit shown in FIG. 2 is long time lug between the potential change at the internal input terminal 2 and the potential change at the external signal terminal 3. The reason why the long time lug is introduced is that the pull-up resistor R has extremely large resistance. The large resistance results in large time constant RC coupled to the external bus system, and the output signal is slowly changed.

SUMMARY OF THE INVENTION

It is therefore an important object of the present invention to provide an input/output interface circuit, which achieves a high switching speed without sacrifice of the power consumption on a power supply line VDD2.

To accomplish the object, the present invention proposes to restrict the potential level at a signal terminal by means of a limiter connected between a tri-state buffer and the signal terminal.

In accordance with one aspect of the present invention, there is provided an interface circuit comprising a tri-state buffer changing an output terminal thereof between high impedance state and low impedance state depending upon a potential level at a control terminal thereof and selectively supplying a first power voltage and a second power voltage different from the first power voltage to the output terminal depending upon a potential level at an input terminal thereof in the low impedance state, and a limiter connected between the output terminal and a signal terminal and reducing the first power voltage to a third power voltage between the first power voltage and the second power voltage so as to change a signal at the signal terminal within a potential range narrower than the potential range between the first power voltage and the second power voltage.

BRIEF DESCRIPTION OF THE DRAWINGS

The features and advantages of the tri-state buffer will be more clearly understood from the following description taken in conjunction with the accompanying drawings in which.

DESCRIPTION OF THE PREFERRED EMBODIMENTS

First Embodiment

Figure 1:
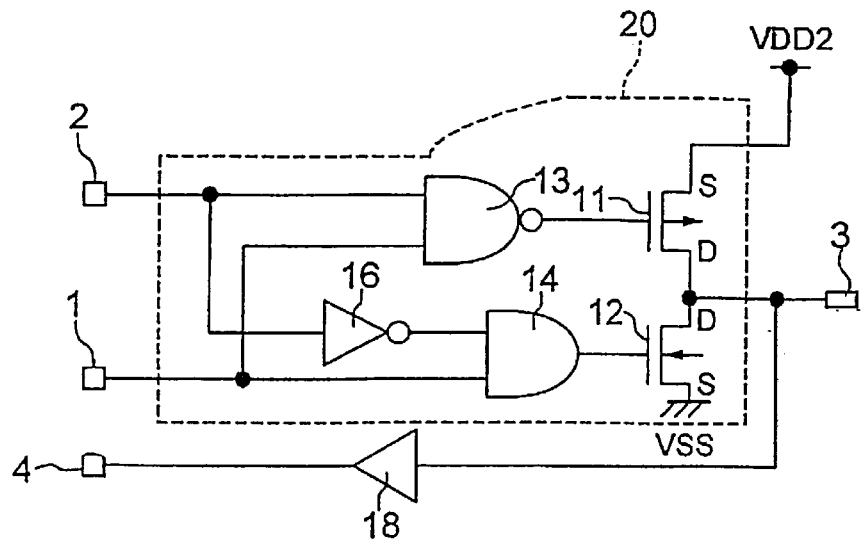
FIG. 1 is a circuit diagram showing the circuit configuration of the prior art input/output interface circuit with the standard tri-state buffer.
Figure 2:
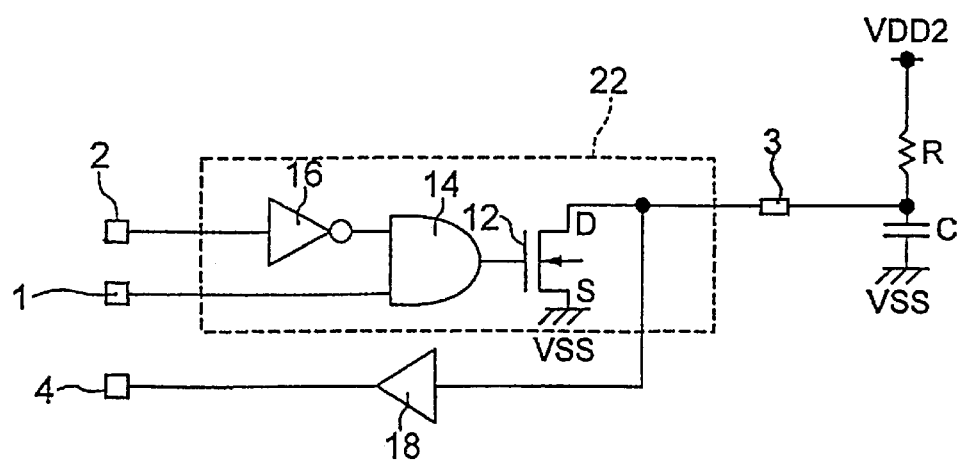
FIG. 2 is a circuit diagram showing the circuit configuration of the prior art input/output interface circuit with the open-drain type tri-state buffer.
Figure 3:
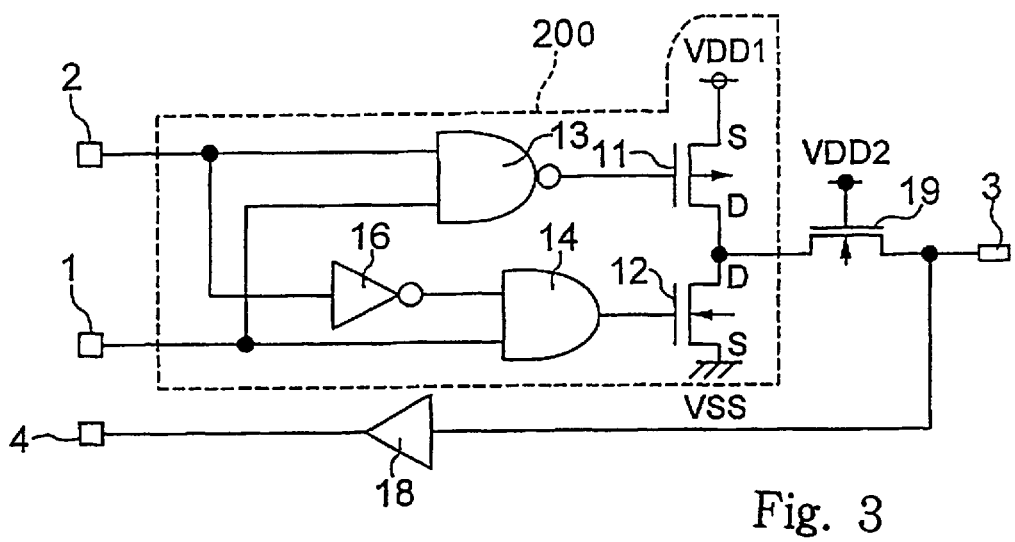
FIG. 3 is a circuit diagram showing the circuit configuration of an input/output interface circuit according to the present invention.

Referring to FIG. 3 of the drawings, an input/output interface circuit embodying the present invention largely comprises a signal input circuit 18 and a signal output circuit. An internal control terminal 1, an internal input terminal 2, an external signal terminal 3 and an internal output terminal 4 are associated with the input/output interface circuit as similar to the prior art input/output interface circuit. The signal input circuit 18 is similar to that of the prior art input/output interface circuit, and no further description is incorporated hereinbelow for the sake of simplicity.

The signal output circuit includes a tri-state buffer 200 and an n-channel enhancement type field effect transistor 19. The internal control terminal 1 and the internal input terminal 2 are connected to the tri-state buffer 200. The tri-state buffer 200 is changed between high impedance state and low impedance state depending upon the potential level at the internal control terminal 1. While the tri-state buffer 200 is operating in the low impedance state, the tri-state buffer 200 is responsive to the potential level at the internal input terminal 2, and changes the potential level at the output node thereof between a power voltage level VDD1 and the ground level VSS. The n-channel enhancement type field effect transistor 19 is connected between the output node of the tri-state buffer 200 and the external signal terminal 3, and another power voltage line VDD2 is connected to the gate electrode of the n-channel enhancement type field effect transistor 19. The potential level on the power supply line VDD2 is lower than the power voltage level VDD1. For this reason, the n-channel enhancement type field effect transistor 19 restricts the potential level at the external signal terminal 3 between the power voltage level VDD2 and the ground level.

The tri-state buffer 200 includes a complementary inverter, i.e., a series combination of a p-channel enhancement type field effect transistor 11 and an n-channel enhancement type field effect transistor 12, a two-input NAND gate 13, a two-input AND gate 14 and an inverter 16. The complementary inverter 11/12 is connected between a power voltage line VDD1 at the power voltage level VDD1 and a ground line VSS at the ground level VSS, and the external signal terminal 3 is connected through the n-channel enhancement type field effect transistor 19 to the common drain node between the p-channel enhancement type field effect transistor 11 and the n-channel enhancement type field effect transistor 12.

The internal control terminal 1 is directly connected to one input node of the two-input NAND gate 13 and one input node of the two-input AND gate 14. The internal data input terminal 2 is directly connected to the other input node of the two-input NAND gate 13, and is connected through the inverter 16 to the other input node of the AND gate 14. The output node of the two-input NAND gate 13 is connected to the gate electrode of the p-channel enhancement type field effect transistor 11, and the output node of the two-input AND gate 14 is connected to the gate electrode of the n-channel enhancement type field effect transistor 12.

The signal output circuit behaves as follows. When a control signal changes the internal control terminal 1 to a low voltage level, the two-input NAND gate 13 and the two-input AND gate 14 are disabled with the low voltage level at the internal control terminal 1, and fix the output nodes to a high voltage level and the low voltage level, respectively. The high voltage level and the low voltage level are supplied to the gate electrode of the p-channel enhancement type field effect transistor 11 and the n-channel enhancement type field effect transistor 12, respectively, and both field effect transistors 11/12 are turned off. Thus, the tri-state buffer 200 enters the high impedance state in the presence of the control signal of the low voltage level. Although the n-channel enhancement type field effect transistor 19 is turned on at all times, the complementary inverter 11/12 does not influence the potential level at the external signal terminal 3.

When the control signal is changed to the high voltage level, the two-input NAND gate 13 and the two-input AND gate 14 are enabled with the high voltage level, and become responsive to the potential level at the internal input terminal 2.

If the internal input terminal 2 is in the high voltage level, the high voltage level is directly supplied to the two-input NAND gate 13, and the two-input NAND gate 13 changes the output node to the low level. On the other hand, the inverter 16 supplies the low voltage level to the two-input AND gate 14, and the two-input AND gate 14 changes the output node to the low voltage level. With the low voltage level, the p-channel enhancement type field effect transistor 11 turns on, and the p-channel enhancement type field effect transistor 12 turns off. Thus, the power supply line VDD1 is connected through the p-channel enhancement type field effect transistor 11 to the n-channel enhancement type field effect transistor 19. Since the power voltage VDD2 is applied to the gate electrode of the n-channel enhancement type field effect transistor 19, the n-channel enhancement type field effect transistor 19 does not transfer the power voltage level VDD1 to the external signal terminal 3, but allows the external signal terminal 3 to rise to the power voltage level VDD2. An output signal of the high voltage level VDD2 is supplied from the external signal terminal 3 to the external bus system.

If the internal input terminal 2 is in the low voltage level, the low voltage level is directly supplied from the internal input terminal 2 to the two-input NAND gate 13, and the two-input NAND gate 13 changes the output node to the high voltage level. With the high voltage level, the p-channel enhancement type field effect transistor 11 turns off, and the external signal terminal 3 is electrically isolated from the power supply line VDD1. On the other hand, the inverter 16 supplies the high voltage level to the two-input AND gate 14, and the two-input AND gate 14 changes the output node to the high voltage level. With the high voltage level, the n-channel enhancement type field effect transistor 12 turns on, and the external signal terminal 3 is connected through the n-channel enhancement type field effect transistors 19 and 12 to the ground line VSS. The external signal terminal 3 is discharged through the n-channel enhancement type field effect transistors 19 and 12 to the ground line VSS, and the output signal is changed to the low voltage level. Thus, the signal output circuit changes the external signal terminal 3 between the power voltage level VDD2 and the ground level VSS in the low impedance state, and the output signal is swung in the narrow potential range.

Although the input/output interface circuit is powered through the two power supply lines VDD1 and VDD2, the gate insulating layer electrically isolates the gate electrode and, accordingly, the power supply line VDD2 from the channel, and any current does not flow from the power supply line VDD2 through the n-channel enhancement type field effect transistor 19. For this reason, the consumption of the power voltage VDD2 is substantially zero. This means that only a small-sized step-down circuit is required for the input/output interface circuit according to the present invention. Any large resistor is not connected to the external signal terminal 3, and the output signal rises to the power voltage level VDD2 at a high speed. Thus, the input/output interface circuit implementing the first embodiment achieves a high speed switching action without sacrifice of the power consumption on the power supply line VDD2.

Second Embodiment

Figure 4:
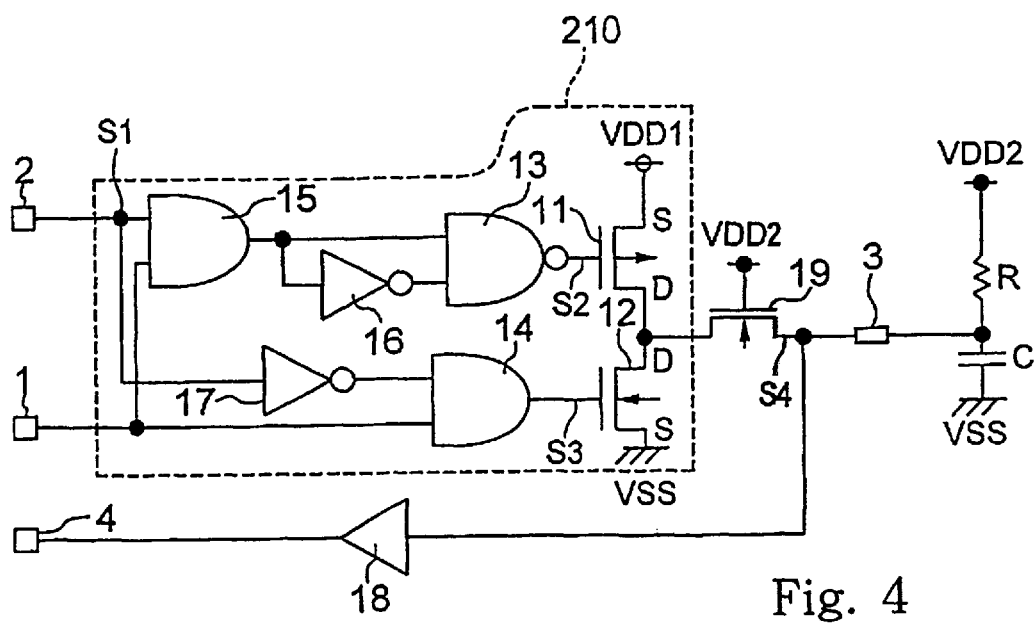
FIG. 4 is a circuit diagram showing the circuit configuration of another input/output interface circuit according to the present invention.

Turning to FIG. 4, another input/output interface circuit embodying the present invention also largely comprises a signal input circuit 18 and a signal output circuit. The signal input circuit 18 is similar to that of the first embodiment, and no further description is incorporated hereinbelow.

The signal output circuit includes an open-drain type tri-state buffer 210, an n-channel enhancement type field effect transistor 19, and an external signal terminal 3 is connected through a pull-up resistor R to a power supply line VDD2. A parasitic capacitor C is further coupled to the external signal terminal 3. The open drain type tri-state buffer is powered through a power supply line VDD1 higher in potential level than the power supply line VDD2, and the power supply line VDD2 is connected to the gate electrode of the n-channel enhancement type field effect transistor 19. When an output signal is changed to the high voltage level equal to the power voltage level VDD2, the open-drain type tri-state buffer 210 supplies the current from the power supply line VDD1 through the n-channel enhancement type field effect transistor 19 to the external signal terminal 3 together with the power supply line VDD2. For this reason, the external signal terminal 3 rises to the power voltage level VDD2 at a high speed.

The open-drain type tri-state buffer 210 includes a complementary inverter 11/12, a two-input NAND gate 13, two-input AND gates 14/15 and inverters 16/17. The complementary inverter 11/12 is implemented by a series combination of a p-channel enhancement type field effect transistor 11 and an n-channel enhancement type field effect transistor 12, and the series combination 11/12 is connected between the power supply line VDD1 and a ground line VSS.

An internal control terminal 1 is connected to one input node of the two-input AND gate 14 and one input node of the other two-input AND gate 15. An internal input terminal 2 is directly connected to the other input node S1 of the two-input AND gate 15, and is connected through the inverter 17 to the other input node of the two-input AND gate 14. The output node of the AND gate 15 is directly connected to one input node of the two-input NAND gate 13, and is connected through the inverter 16 to the other input node of the two-input NAND gate 13. The output node S2 of the two-input NAND gate 13 is connected to the gate electrode of the p-channel enhancement type field effect transistor 11, and the output node S3 of the two-input AND gate 14 is connected to the gate electrode of the n-channel enhancement type field effect transistor 12. The drain node S4 of the n-channel enhancement type field effect transistor 19 is connected to the external signal terminal 3.

The signal output circuit behaves as follows. When the internal control terminal 1 is changed to the low voltage level, the two-input AND gates 14/15 are disabled with the low voltage level, and fix the output nodes to the low voltage level. The two-input AND gate 14 supplies the low voltage level from the output node S3 to the gate electrode of the n-channel enhancement type field effect transistor 12, and keeps the n-channel enhancement type field effect transistor 12 the off-state. On the other hand, the two-input AND gate 14 disables the two-input NAND gate 13 with the low voltage level, and the two-input NAND gate 13 fixes the output node S2 to the high voltage level. With the high voltage level, the p-channel enhancement type field effect transistor 11 is turned off. Thus, both of the p-channel enhancement type field effect transistor 11 and the n-channel enhancement type field effect transistor 12 are turned off in the presence of the low voltage level at the internal control node 1, and the open-drain type tri-state buffer 210 enters the high impedance state.

Figure 5:
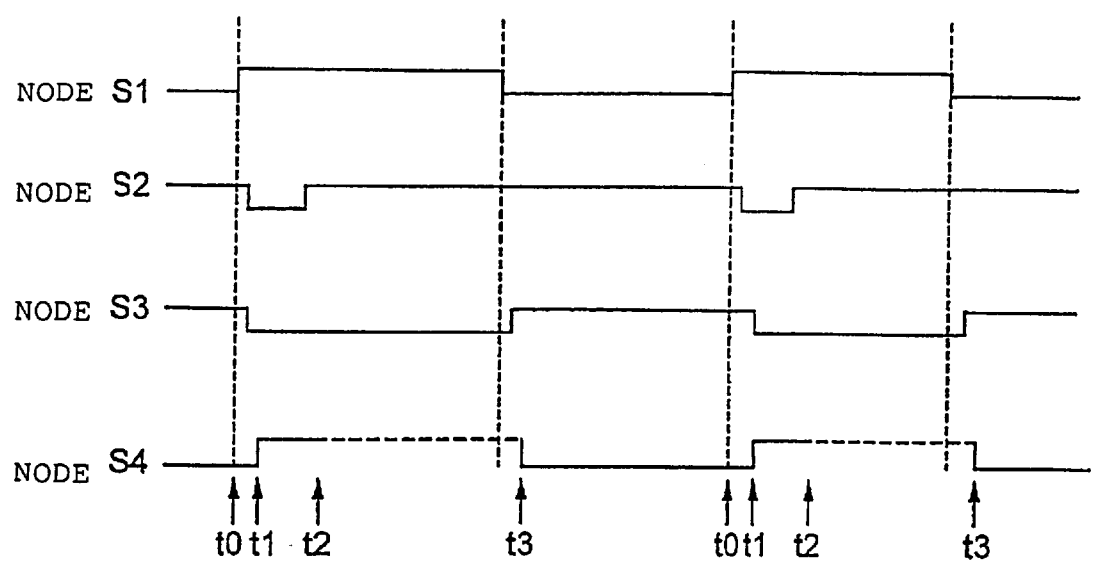
FIG. 5 is a timing chart showing the circuit behavior of the input/output interface circuit shown in FIG. 4.

When the internal control terminal 1 is changed to the high voltage level, both of the two-input AND gates 14/15 are enabled with the high voltage level, and the open-drain tri-state buffer 210 becomes responsive to the potential level at the internal input terminal 2. In the low impedance state, the open-drain type tri-state buffer 210 behaves as shown in FIG. 5.

The internal input terminal 2 and, accordingly, the input node S1 are changed to the high voltage level at time t0. The two-input AND gate 15 changes the output node thereof to the high voltage level, and enables the two-input NAND gate 13. The two-input NAND gate 13 changes the output node S2 to the low voltage level, because the inverter 16 keeps the output node thereof in the high voltage level. As a result, the p-channel enhancement type field effect transistor 19 turns on.

On the other hand, the inverter 17 changes the output node thereof to the low level, and the two-input AND gate 14 changes the output node S3 to the low voltage level after a short delay time. With the low voltage level, the n-channel enhancement type field effect transistor 12 turns off. Thus, both of the p-channel enhancement type field effect transistor 11 and the n-channel enhancement type field effect transistor 12 are turned off from time t2 to time t3. The power supply line VDD1 changes the drain node S4 with the current at time t1. However, the n-channel enhancement type field effect transistor 19 restricts the potential level at the drain node S4, and the power voltage level VDD1 is stepped down to the power voltage level VDD2.

The inverter 16 changes the output node thereof to the low voltage level after a short delay time, and causes the two-input NAND gate 13 to recover the output node S2 to the high voltage level at time t2.

The p-channel enhancement type field effect transistor 11 is staying in the on-state from time t1 to time t2, and the current flows from the power supply line VDD1 through the p-channel enhancement type field effect transistor 11 to the n-channel enhancement type field effect transistor 19. Since the power voltage level VDD2 is applied to the gate electrode of the n-channel enhancement type field effect transistor 19, the drain node S4 is not allowed to exceed the power voltage level VDD2. Thus, the n-channel enhancement type field effect transistor 19 restricts the potential level at the drain node S4 to the power voltage level VDD2. The on-resistance of the p-channel/n-channel enhancement type field effect transistors 11/19 is much smaller than the resistance of the pull-up resistor R, and the parasitic capacitor C is rapidly charged as if the parasitic capacitor C is coupled to the power supply line VDD2 without the pull-up resistor R. The power supply line VDD2 continuously supplies the electric current through the pull-up resistor R to the external signal terminal 3, and the electric current flows from both power supply lines VDD1/VDD2 to the external signal terminal 3. This results in that the external signal terminal 3 rapidly rises to the power voltage level VDD2.

Although the p-channel enhancement type field effect transistor 11 turns off at time t2, the power supply line VDD2 pulls up the external signal terminal 3.

When the internal input terminal 2 and the input node S1 are changed to the low level, the inverter 17 changes the output node thereof to the high level after the short delay time, and the two-input AND gate 14 changes the output node S3 to the high level at time t3. The high level is supplied from the output node S3 to the gate electrode of the n-channel enhancement type field effect transistor 12, and causes the n-channel enhancement type field effect transistor 12 to turn on. On the other hand, the low voltage level at the input node S1 causes the two-input AND gate 15 to change the output node thereof to the low level, and the two-input NAND gate 13 is disabled with the low level. The two-input NAND gate 13 keeps the output node S2 in the high level, and the p-channel enhancement type field effect transistor 11 continues to be turned off. The electric current is discharged through the n-channel enhancement type field effect transistor 12 to the ground line VSS, and the drain node S4 is decayed to the low voltage level at time t3.

The open-drain type tri-state buffer allows the power supply line VDD1 to supply the current through the p-channel enhancement type field effect transistor 11 and the n-channel enhancement type field effect transistor 19 to the external signal terminal 3 from time t1 to time t2, and the potential level at the external signal terminal 3 rapidly rises to the power voltage level VDD2. However, the consumption of the power voltage VDD2 is not increased, because the power supply line VDD2 is connected to the gate electrode of the n-channel enhancement type field effect transistor 19. Thus, the signal output circuit implementing the second embodiment achieves the high-speed switching action without sacrifice of the power consumption.

Although particular embodiments of the present invention have been shown and described, it will be apparent to those skilled in the art that various changes and modifications may be made without departing from the spirit and scope of the present invention.

For example, the channel conductivity is exchangeable between the n-type and the p-type.

Other kinds of logic gate such as, for example, a NOR gate is available for the tri-state buffer.

What is claimed is:

1. An interface circuit comprising
   a tri-state buffer changing an output terminal thereof between high impedance state and low impedance state depending upon a potential level at a control terminal thereof and selectively supplying a first power voltage and a second power voltage different from said first power voltage to said output terminal depending upon a potential level at an input terminal thereof in said low impedance state, and
   a limiter connected between said output terminal and a signal terminal and reducing said first power voltage to a third power voltage between said first power voltage and said second power voltage so as to change a signal at said signal terminal within a potential range narrower than the potential range between said first power voltage and said second power voltage.

2. The interface circuit as set forth in claim 1, further comprising a signal input circuit connected at an input node thereof to said signal terminal and at an output node thereof to another signal terminal.

3. The interface circuit as set forth in claim 1, in which said limiter has a first field effect transistor having a gate electrode applied with said third power voltage.

4. The interface circuit as set forth in claim 3, in which said first field effect transistor is an n-channel enhancement type.

5. The interface circuit as set forth in claim 1, in which said tri-state buffer includes
   a series combination of a first field effect transistor of a first channel conductivity type, said output terminal and a second field effect transistor of a second channel conductivity type opposite to said first channel conductivity type connected between a source of said first power voltage and a source of said second power voltage, and
   a logic circuit connected to said control terminal and said input terminal so as to produce control signals respectively applied to said first and second field effect transistors so as to selectively changing said first and second field effect transistors between one-state and off-state depending upon the combination of said potential levels at said control terminal and said input terminal.

6. The interface circuit as set forth in claim 5, in which said limiter has a third field effect transistor having a gate electrode applied with said third power voltage.

7. The interface circuit as set forth in claim 6, in which said second and third field effect transistors are an n-channel enhancement type, and said first field effect transistor is a p-channel enhancement type.

8. The interface circuit as set forth in claim 5, in which said logic circuit includes

- a NAND gate having a first input node connected to said control terminal and a second input node connected to said input terminal and a first output node connected to a gate electrode of said first field effect transistor,
- an inverter having a second output node and a third input node connected to said input terminal, and
- an AND gate having a fourth input node connected to said second output node, a fifth input node connected to said control terminal and a third output node connected to a gate electrode of said second field effect transistor.

9. The interface circuit as set forth in claim 8, in which said limiter has a third field effect transistor having a gate electrode applied with said third power voltage.

10. The interface circuit as set forth in claim 9, in which said second and third field effect transistors are an n-channel enhancement type, and said first field effect transistor is a p-channel enhancement type.

11. The interface circuit as set forth in claim 5, in which said logic circuit includes

- a first AND gate having a first input node connected to said control terminal, a second input node connected to said input terminal and a first output node,
- a delay circuit having a third input node connected to said first output node and a second output node and introducing a delay in the propagation from said third input node and said second output node,
- a NAND gate having a fourth input node connected to said first output node and a fifth input node connected to said second output node and a third output node connected to a gate electrode of said first field effect transistor,
- an inverter having a sixth input node connected to said input terminal and a fourth output node, and
- a second AND gate having a seventh input node connected to said fourth output node and an eighth input node connected to said control terminal and a fifth output node connected to a gate electrode of said second field effect transistor, and
- said signal terminal is further connected through a pull-up resistor to a source of said third power voltage.

12. The interface circuit as set forth in claim 11, in which said limiter has a third field effect transistor having a gate electrode applied with said third power voltage.

13. The interface circuit as set forth in claim 12, in which said second and third field effect transistors are an n-channel enhancement type, and said first field effect transistor is a p-channel enhancement type.

\* \* \* \* \*